(12) United States Patent
Kwon et al.

(10) Patent No.: US 12,456,704 B2
(45) Date of Patent: Oct. 28, 2025

(54) SEMICONDUCTOR PACKAGE AND METHOD FOR MANUFACTURING SEMICONDUCTOR PACKAGE

(71) Applicant: SAMSUNG ELECTRONICS CO., LTD., Suwon-si (KR)

(72) Inventors: Yonghwan Kwon, Yongin-si (KR); Yongjin Park, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/655,471

(22) Filed: May 6, 2024

(65) Prior Publication Data
US 2024/0290739 A1    Aug. 29, 2024

Related U.S. Application Data (63) Continuation of application No. 17/646,675, filed on Dec. 30, 2021, now Pat. No. 11,996,378.

(30) Foreign Application Priority Data

May 20, 2021    (KR) .................. 10-2021-0064713

(51) Int. Cl.
*H01L 23/00* (2006.01)
*H01L 23/31* (2006.01)
*H01L 23/498* (2006.01)

(52) U.S. Cl.
CPC .......... *H01L 24/08* (2013.01); *H01L 23/3107* (2013.01); *H01L 23/49822* (2013.01);
(Continued)

(58) Field of Classification Search
CPC .............. H01L 24/08; H01L 23/3107; H01L 23/49822; H01L 23/49827; H01L 23/49838
See application file for complete search history.

(56) References Cited

U.S. PATENT DOCUMENTS 8,710,639 B2 *   4/2014   Kikuchi ................. H01L 24/82
                                              257/679
8,729,714 B1    5/2014   Meyer
(Continued)

FOREIGN PATENT DOCUMENTS

KR   10-2007-0097721 A   10/2007
KR   10-2015-0018944 A    2/2015
(Continued)

OTHER PUBLICATIONS

Office Action dated May 20, 2025 issued in corresponding Korean Patent Application No. 10-2021-0064713.

*Primary Examiner* — Nathan W Ha
(74) *Attorney, Agent, or Firm* — Morgan, Lewis & Bockius LLP (57) ABSTRACT

A semiconductor package includes a first redistribution structure, including a first insulating layer and a first redistribution layer disposed below the first insulating layer; a semiconductor chip disposed on the first redistribution structure, including a connection terminal electrically connected to the first redistribution layer and buried in the first insulating layer; an encapsulant disposed on the first redistribution structure that seals a portion of the semiconductor chip; a second redistribution structure, including a second redistribution layer disposed on the encapsulant; and a through via, including a pattern portion buried in the first insulating layer and electrically connected to the first redistribution layer and a via portion penetrating through the encapsulant and electrically connecting the pattern portion and the second redistribution layer. The connection terminal and the pattern portion are located at a first level and are electrically connected to each other at a second level lower than the first level.

19 Claims, 9 Drawing Sheets

(52) U.S. Cl.
 CPC .. *H01L 23/49827* (2013.01); *H01L 23/49838* (2013.01); *H01L 2224/08235* (2013.01)

(56) References Cited

U.S. PATENT DOCUMENTS

| | | | |
|---|---|---|---|
| 10,504,826 B1 | 12/2019 | Fillion et al. | |
| 10,515,901 B2 | 12/2019 | Lin et al. | |
| 10,559,525 B2 | 2/2020 | Yu | |
| 10,566,299 B2* | 2/2020 | Chiang | H01L 23/66 |
| 10,699,981 B2 | 6/2020 | Huang et al. | |
| 2018/0240751 A1 | 8/2018 | Harr et al. | |
| 2019/0131224 A1 | 5/2019 | Choi et al. | |
| 2019/0206755 A1 | 7/2019 | Choi et al. | |
| 2019/0237382 A1 | 8/2019 | Kim et al. | |
| 2019/0273030 A1 | 9/2019 | Lim et al. | |
| 2019/0287820 A1* | 9/2019 | Huang | H01L 21/76843 |
| 2019/0333837 A1 | 10/2019 | Kang et al. | |
| 2020/0035625 A1* | 1/2020 | Wang | H01L 23/552 |
| 2020/0058622 A1* | 2/2020 | Chen | H01L 24/73 |
| 2020/0091099 A1 | 3/2020 | Choi et al. | |
| 2020/0161203 A1 | 5/2020 | Kim et al. | |
| 2020/0161204 A1* | 5/2020 | Kim | H01L 23/3128 |
| 2020/0343184 A1* | 10/2020 | Fujishima | H01L 23/481 |
| 2021/0020505 A1 | 1/2021 | Jang et al. | |
| 2021/0057303 A1* | 2/2021 | Chen | H01L 21/486 |
| 2021/0183785 A1 | 6/2021 | Kwon | |
| 2021/0210427 A1 | 7/2021 | Kang et al. | |
| 2021/0257324 A1* | 8/2021 | Park | H01L 24/73 |
| 2021/0327838 A1* | 10/2021 | Hou | H01L 24/03 |
| 2021/0335715 A1* | 10/2021 | Kao | H01L 21/4857 |
| 2021/0343634 A1 | 11/2021 | Choi et al. | |
| 2021/0384153 A1 | 12/2021 | Lee et al. | |
| 2021/0398905 A1 | 12/2021 | Teng et al. | |
| 2021/0407923 A1 | 12/2021 | Kim et al. | |
| 2022/0006173 A1 | 1/2022 | Lee et al. | |
| 2022/0344248 A1 | 10/2022 | Lau et al. | |
| 2022/0352061 A1 | 11/2022 | Kang et al. | |
| 2022/0375889 A1 | 11/2022 | Kwon et al. | |

FOREIGN PATENT DOCUMENTS

| | | |
|---|---|---|
| KR | 10-2019-0124892 A | 11/2019 |
| KR | 10-2020-0057358 A | 5/2020 |

\* cited by examiner

SEMICONDUCTOR PACKAGE AND METHOD FOR MANUFACTURING SEMICONDUCTOR PACKAGE

CROSS-REFERENCE TO RELATED APPLICATION(S)

This application is a continuation of U.S. patent application Ser. No. 17/646,675, filed on Dec. 30, 2021 in the U.S. Patent and Trademark Office, which claims priority under 35 U.S.C. 119 from Korean Patent Application No. 10-2021-0064713, filed on May 20, 2021 in the Korean Intellectual Property Office, the contents of both of which are herein incorporated by reference in their entireties.

TECHNICAL FIELD

Embodiments of the present inventive concept directed to a semiconductor package and a method for manufacturing the semiconductor package.

DISCUSSION OF THE RELATED ART

As electronic products become further miniaturized and achieve higher performance, a mounting area of a semiconductor package needs to be reduced. Accordingly, a package-on-package (POP) structure in which a plurality of packages are stacked has been proposed. To implement a PoP structure, a through-via is formed that provides a vertical electrical connection path in the semiconductor package.

SUMMARY

An embodiment of the present inventive concept provides a semiconductor package that has a high degree of freedom in designing a redistribution layer.

According to an embodiment of the present inventive concept, a semiconductor package includes a first redistribution structure that includes a first insulating layer and a first redistribution layer disposed below the first insulating layer; a semiconductor chip disposed on the first redistribution structure, where the semiconductor chip includes a connection terminal electrically connected to the first redistribution layer and buried in the first insulating layer; an encapsulant disposed on the first redistribution structure where the encapsulant seals at least a portion of the semiconductor chip; a second redistribution structure that includes a second redistribution layer disposed on the encapsulant; and a through via that includes a pattern portion buried in the first insulating layer and electrically connected to the first redistribution layer, and a via portion that penetrates through the encapsulant and electrically connects the pattern portion and the second redistribution layer. The connection terminal and the pattern portion are located at a first level, and are electrically connected to each other at a second level that is lower than the first level.

According to an embodiment of the present inventive concept, a semiconductor package includes a redistribution structure that includes a first surface and a second surface opposite to the first surface, and an insulating layer and a redistribution layer disposed below the insulating layer; a semiconductor chip disposed on the first surface of the redistribution structure, where the semiconductor chip includes a connection terminal electrically connected to the redistribution layer and is buried in the insulating layer; and a through via that includes a pattern portion electrically connected to the redistribution layer and is buried in the insulating layer, and a via portion that extends from the pattern portion and is located on the insulating layer. A height in a direction perpendicular to the first surface of the pattern portion is greater than a height of the connection terminal.

According to an embodiment of the present inventive concept, a semiconductor package includes a redistribution structure that includes a first surface and a second surface opposite to the first surface, and an insulating layer and a redistribution layer disposed below the insulating layer; a semiconductor chip disposed on the first surface of the redistribution structure, where the semiconductor chip includes a connection terminal electrically connected to the redistribution layer and buried in the insulating layer; and a through via that includes a pattern portion electrically connected to the redistribution layer and buried in the insulating layer, and a via portion that extends from the pattern portion and is located on the insulating layer. A height of a portion of the pattern portion buried in the insulating layer is greater than a height of a portion of the connection terminal buried in the insulating layer.

According to an embodiment of the present inventive concept, a method of manufacturing a semiconductor package includes disposing a semiconductor chip on a tape wherein the semiconductor chip includes a connection terminal that is buried in the tape; forming an encapsulant on the tape that encapsulates the semiconductor chip, wherein the encapsulant has a front side that faces the tape and a back side opposite to the front side; arranging the encapsulant and the semiconductor chip on a carrier wherein the back side faces the carrier; forming a through-hole that penetrates through the encapsulant; forming a seed layer along an inner wall of the through-hole and the front side; forming a through-via using the seed layer where the through-via includes a via portion that fills the through-hole and a pattern portion on the front side; removing an exposed portion of the seed layer from the pattern portion; and forming a redistribution structure that includes an insulating layer on the front side that covers the connection terminal and the pattern portion, a redistribution layer on the insulating layer, and a redistribution via that penetrates through the insulating layer and connects the redistribution layer to the pattern portion and the connection terminal.

DETAILED DESCRIPTION

Hereinafter, embodiments of the present inventive concept will be described with reference to the accompanying drawings.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 1A:
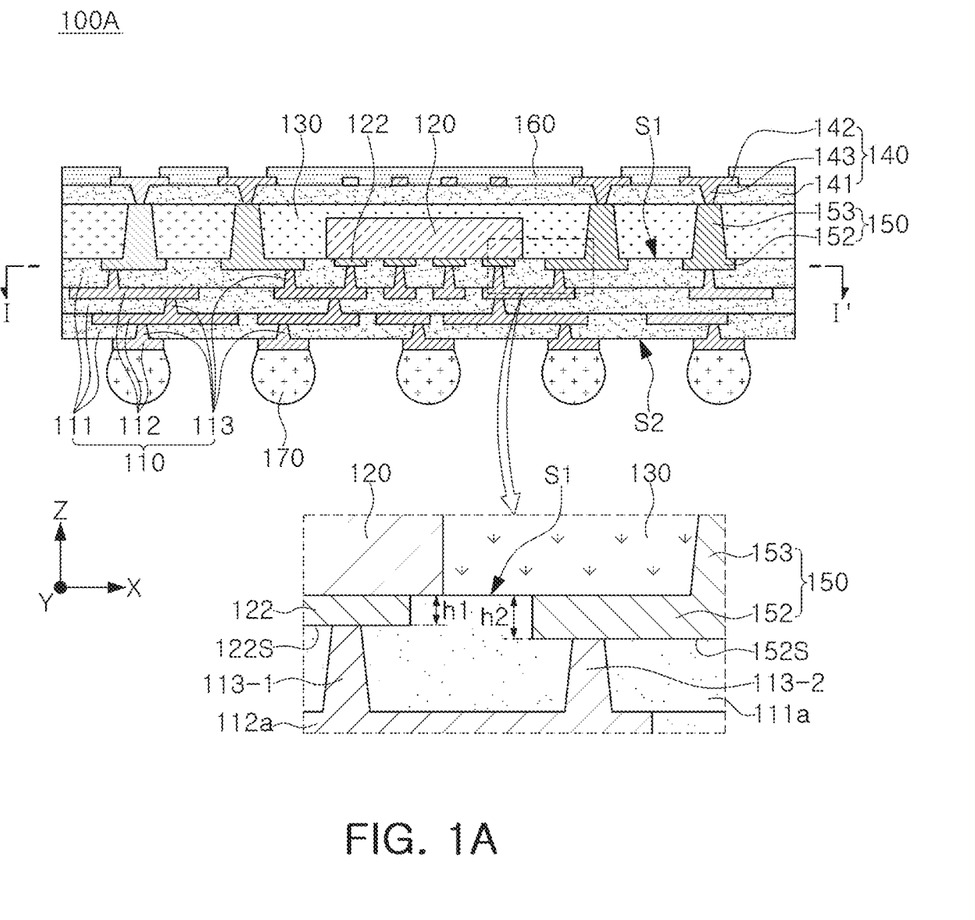
FIG. 1A is a cross-sectional view of a semiconductor package according to an embodiment of the present inventive concept.
Figure 1B:
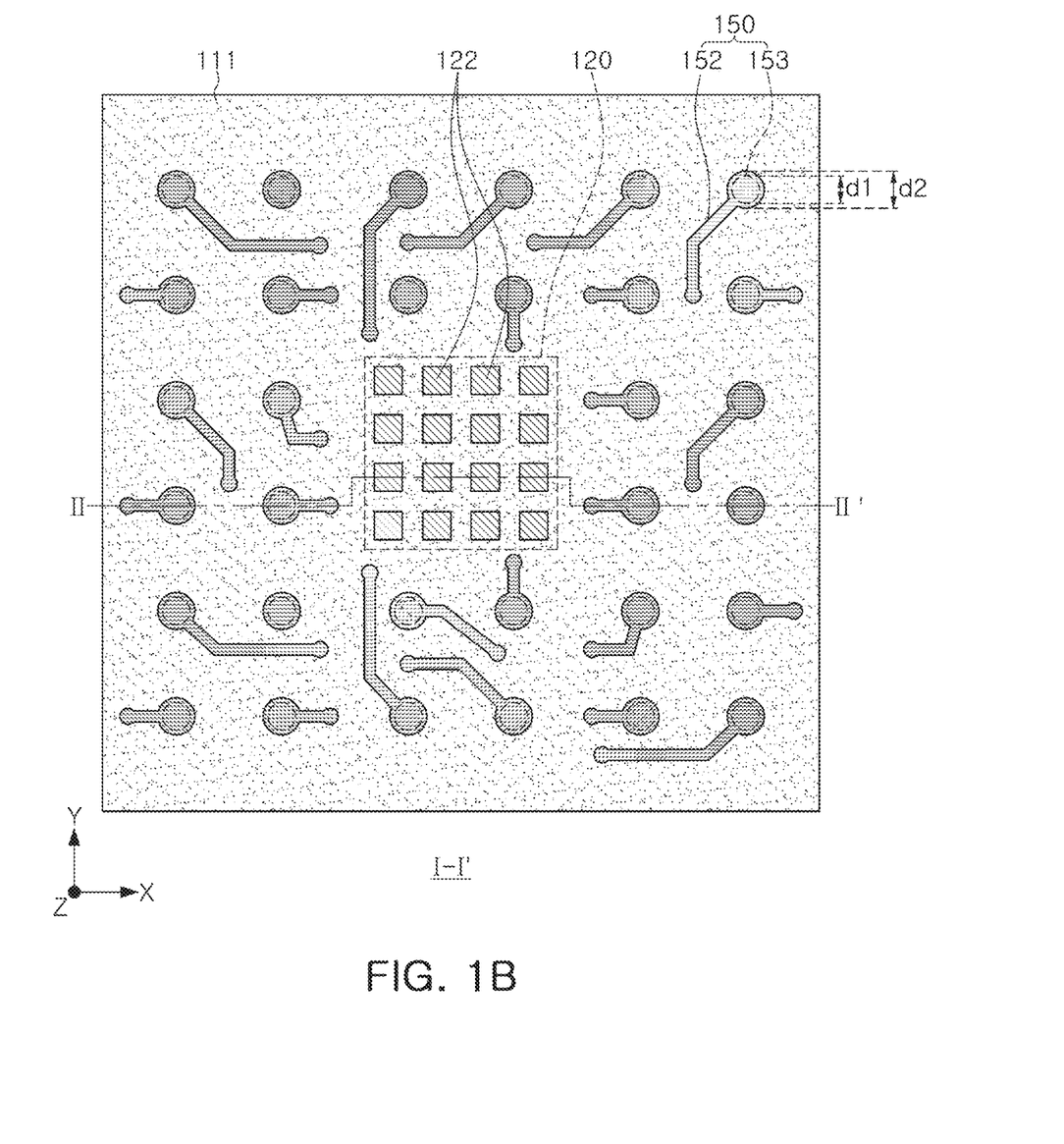
FIG. 1B is a plan view of a semiconductor package of FIG. 1A, taken along line I-I'.

FIG. 1A is a cross-sectional view of a semiconductor package 100A according to an embodiment of the present inventive concept, and FIG. 1B is a plan view of a semiconductor package of FIG. 1A, taken along line I-I'. FIG. 1A illustrates a vertical section corresponding to line II-II' in FIG. 1B.

Referring to FIGS. 1A and 1B, a semiconductor package 100A according to an embodiment includes a first redistribution structure 110, a semiconductor chip 120, and a through-via 150. In addition, the semiconductor package 100A further includes an encapsulant 130 and a second redistribution structure 140.

The first redistribution structure 110 is a support substrate on which the semiconductor chip 120 is mounted, and has a first surface S1 and a second surface S2 located opposite to the first surface S1, and includes at least one first insulating layer 111, at least one first redistribution layer 112 respectively disposed below the at least one first insulating layer 111, and at least one first redistribution via 113 that penetrates through the at least one first insulating layer 111 and is electrically connected to the at least one first redistribution layer 112. The first redistribution structure 110 redistribute connection terminals 122 of the semiconductor chip 120, and may include a greater or lesser number of first insulating layers 111, first redistribution layers 112, and first redistribution vias 113, than those illustrated in the drawing. A connection bump 170 electrically connected to the first redistribution layer 112 is disposed on the second surface S2 of the first redistribution structure 110. The connection bump 170 is disposed below a lowermost first redistribution layer, and may have a spherical or ball-like shape made of a low melting point metal, such as tin (Sn), indium (In), bismuth (Bi), antimony (Sb), copper (Cu), silver (Ag), zinc (Zn), or lead (Pb), or an alloy thereof, such as Sn—Ag—Cu.

The first insulating layer 111 includes an insulating resin. The insulating resin may be a thermosetting resin such as an epoxy resin, a thermoplastic resin such as polyimide, or a resin impregnated with an inorganic filler and/or a glass fiber, a glass cloth, or a glass fabric, such as a prepreg, an Ajinomoto build-up film (ABF), FR-4, or bismaleimide triazine (BT). In an embodiment, the first insulating layer 111 includes a photosensitive resin such as a photoimageable dielectric (PID). The first insulating layer 111 may include a plurality of first insulating layers 111 stacked in a vertical direction (a Z-axis direction). Depending on a process, a boundary between the plurality of first insulating layers 111 may be unclear. In addition, for convenience of description, only three insulating layers 111 are illustrated in the drawings, but embodiments of the present inventive concept are not limited thereto. In some embodiments, the first redistribution structure 110 includes four or more first insulating layers 111.

The first redistribution layer 112 includes, for example, a metal such as at least one of copper (Cu), aluminum (Al), silver (Ag), tin (Sn), gold (Au), nickel (Ni), lead (Pb), or titanium (Ti), or alloys thereof. The first redistribution layer 112 includes, for example, at least one of a ground pattern, a power pattern, or a signal pattern. The signal pattern provides a path through which various signals, such as a data signal, etc., are transmitted/received, except for a ground signal or a power signal. The ground pattern provides a path through which a ground signal is transmitted/received, and the power pattern provides a path through which a power signal is transmitted/received. The first redistribution layer 112 includes a plurality of first redistribution layers 112 that are respectively disposed below each of the plurality of first insulating layers 111. The plurality of first redistribution layers 112 are electrically connected to each other through the first redistribution vias 113. In an embodiment, a lowermost first redistribution layer that contacts the connection bump 170 has a greater thickness than a first redistribution layer thereon. The number of first redistribution layers 112 is determined according to the number first insulating layers 111, and according to embodiments, may include more or fewer layers than illustrated in the drawings.

The first redistribution via 113 includes a plurality of first redistribution vias 113. The first redistribution vias 113 are electrically connected to the first redistribution layers 112, and include a signal via, a ground via, and a power via. The first redistribution vias 113 include, for example, a metal such as at least one of copper (Cu), aluminum (Al), silver (Ag), tin (Sn), gold (Au), nickel (Ni), lead (Pb), or titanium (Ti), or alloys thereof. The first redistribution vias 113 are formed by a metal material being filled in a via hole or a conformal via in which the metal is formed along an inner wall of the via hole. The first redistribution vias 113 are integrated with the first redistribution layer 112, but embodiments of the present inventive concept are not limited thereto.

The semiconductor chip 120 is disposed on the first surface S1 of the first redistribution structure 110, is electrically connected to the first redistribution layer 112, and includes the connection terminals 122 buried in the first insulating layer 111. In some embodiments, the semiconductor chip 120 is an integrated circuit (IC) in a bare state in which a separate bump or wiring layer is not formed, but embodiments are not limited thereto, and in other embodiment, the semiconductor chip 120 is a packaged type integrated circuit. Therefore, the connection terminal 122 may be a pad of a bare chip, such as an aluminum (Al) pad, or a bump formed on the pad, shown in FIG. 2. The integrated circuit of the semiconductor chip 120 is formed on an active wafer. The semiconductor chip 120 includes at least one of silicon (Si), germanium (Ge), or gallium arsenide (GaAs), and various types of integrated circuits may be formed therein. An integrated circuit may be a processor chip such as a central processor (CPU), a graphics processor (GPU), a field programmable gate array (FPGA), an application processor (AP), a digital signal processor, a cryptographic processor, a microprocessor, or a microcontroller, etc., but embodiments are not limited thereto, and in other embodiments, the integrated circuit may be a logic chip such as an analog-to-digital converter, an ASIC (application-specific IC), etc., or a memory chip such as a volatile memory (e.g., DRAM), a non-volatile memory (e.g., ROM or flash memory), etc. . . . The connection terminal 122 electrically connects the integrated circuit of the semiconductor chip 120 to other components.

The encapsulant 130 is disposed on the first surface S1, and encapsulates at least a portion of the semiconductor chip 120. The encapsulant 130 covers a side surface and/or an upper surface of the semiconductor chip 120. The encapsulant 130 includes, for example, at least one of a thermosetting resin such as an epoxy resin, a thermoplastic resin such as polyimide, or a prepreg that includes an inorganic filler, and may further include a glass fiber, ABF, FR-4, BT, or an epoxy molding compound (EMC). In an embodiment, the encapsulant 130 covers a side surface of the through-via 150, and exposes an upper surface of the through-via 150. In this case, when forming the second redistribution structure 140, since a mold via that penetrates through the encapsulant 130 (e.g., EMC or ABF) need not be formed, a second redistribution layer 142 that has a fine pitch can be formed. Therefore, an upper surface of the encapsulant 130 is substantially coplanar with the upper surface of the through-via 150.

The second redistribution structure 140 include a second insulating layer 141 disposed on the encapsulant 130, a second redistribution layer 142 disposed on the second insulating layer 141, and a second redistribution via 143 that penetrates through the second insulating layer 141 and is electrically connected to the second redistribution layer 142 and the through-via 150. In an embodiment, a cover layer 160 is formed on the second redistribution structure 140. The cover layer 160 has an opening that exposes a portion of the second redistribution layer 142. The cover layer 160 includes an insulating material, such as ABF, but embodiments are not limited thereto, and other embodiments include other types of insulating materials. Similarly, a cover layer may be formed on the second surface S2 of the first redistribution structure 110.

The second insulating layer 141 includes an insulating resin similar to that of the first redistribution structure 110. For example, the second insulating layer 141 includes a photosensitive resin such as PID, but embodiments according to the present inventive concept are not limited thereto. In some embodiments, the second insulating layer 141 includes a non-photosensitive resin such as ABF. As described above, in an embodiment, since the encapsulant 130 does not cover the upper surface of the through-via 150, and the second insulating layer 141 is directly formed on the upper surface of the through-via 150, the second redistribution layer 142 and the second redistribution vias 143 have a fine pitch. In addition, when the second insulating layer 141 includes PID, the second redistribution layer 142 and the second redistribution via 143 can be formed to have a fine pitch using a photolithography process, a sputtering process, etc. Features of processes that can implement a fine pitch will be described below with reference to FIG. 7H.

At least a portion of the second redistribution layer 142 is exposed in an upper portion of the semiconductor package 100A, and the exposed portions of the second redistribution layer 142 can be physically and/or electrically coupled to other electronic components outside the semiconductor package 100A. The second redistribution layer 142 includes a metal, such as copper (Cu), aluminum (Al), silver (Ag), tin (Sn), gold (Au), nickel (Ni), lead (Pb), or titanium (Ti) or alloys thereof.

The second redistribution via 143 electrically connects the second redistribution layer 142 to the through-via 150. The second redistribution via 143 includes a metal similar to that of the second redistribution layer 142, and is integrated with the second redistribution layer 142. Similar to the first redistribution via 113, the second redistribution via 143 may be a filled via or a conformal via.

The through-via 150 includes a pattern portion 152 buried in the first insulating layer 111 and electrically connected to the first redistribution layer 112, and a via portion 153 that penetrates through the encapsulant 130 and electrically connects the pattern portion 152 and the second redistribution layer 142. The through-via 150 is disposed adjacent to the semiconductor chip 120, and a plurality of through-vias 150 are disposed around the semiconductor chip 120. The pattern portion 152 is buried in an uppermost first insulating layer 111a of the plurality of first insulating layers 111, and is connected through the first redistribution via 113 to an uppermost first insulating layer 112a that is disposed below the uppermost first insulating layer 111a. The via portion 153 extends in the vertical direction (the Z-axis direction) from the pattern portion 152, and is located on the first insulating layer 111. The pattern portion 152 and the via portion 153 include substantially the same metal. The metal is, for example, at least one of copper (Cu), aluminum (Al), silver (Ag), tin (Sn), gold (Au), nickel (Ni), lead (Pb), or titanium (Ti), or alloys thereof, etc. In an embodiment, since the pattern portion 152 and the via portion 153 are formed through the same plating process, as shown in FIG. 7D, the through-via 150 has an integral structure in which a boundary between the pattern portion 152 and the via portion 153 is indistinguishable. That is, the pattern portion 152 and the via portion 153 are integrally formed. In this case, the pattern portion 152 includes a pad area that has a diameter d2 greater than a diameter d1 of the via portion 153. In addition, in an embodiment, the via portion 153 has a tapered side surface that increases in width closer to the pattern portion 152.

In an embodiment of the present inventive concept, the pattern portion 152 that redistributes the via portion 153 is introduced to freely design a contact point of the first redistribution layer 112 and the through-via 150, and as a result, congestion in the first redistribution layer 112 is reduced and of the design freedom of the first redistribution layer 112 is increased. For example, since the pattern portion 152 is located at a same first level as the connection terminal 122 of the semiconductor chip 120, and the first redistribution layer 112 is located at a second level that is lower than the first level, the pattern portion 152 redistributes the via portion 153 without increasing congestion in the first redistribution layer 112. In an embodiment, an upper surface of the pattern portion 152 is substantially coplanar with the first surface S1 on which the semiconductor chip 120 is mounted, and at least a portion of the upper surface of the pattern portion 152 is in contact with the encapsulant 130. In addition, the pattern portion 152 and the connection terminal 122 are electrically connected to each other through the first redistribution layer 112 at the second level, below the uppermost first insulating layer 111a.

Since the pattern portion 152 of the through-via 150 and the connection terminal 122 of the semiconductor chip 120 are formed by different processes, the pattern portion 152 has a shape different from that of the connection terminal 122, regardless of whether the pattern portion 152 and the connection terminal 122 are at substantially the same level. For example, a lower surface 122S of the connection terminal 122 and a lower surface 152S of the pattern portion 152 are located at different levels. Depending on functional characteristics of the pattern portion 152 that redistributes the via portion 153, etc., the pattern portion 152 may have a shape similar to that of the first redistribution layer 112. For example, in a direction perpendicular to the first surface S1, a height h2 of the pattern portion 152 is greater than a height h1 of the connection terminal 122, and the lower surface 152S of the pattern portion 152 is lower than the lower surface 122S of the connection terminal 122.

Although FIG. 1A shows that the height h1 of the connection terminal 122 and the height h2 of the pattern portion 152 are respectively identical to a height of a portion buried in the uppermost first insulating layer 111a, in some embodiments, the height h1 of the connection terminal 122 and the height h2 of the pattern portion 152 are greater than heights of the respective portions buried in the uppermost first insulating layer 111a. Even in this case, a height of a portion of the pattern portion 152 buried in the uppermost first insulating layer 111a may be greater than a height of a portion of the connection terminal 122 buried in the uppermost first insulating layer 111a, and a height from the first surface S1 to the lower surface 152S of the pattern portion 152 may be greater than a height from the first surface S1 to the lower surface 122S of the connection terminal 122. Similarly, a height of a 1-1 redistribution via 113-1 that connects the uppermost first redistribution layer 112a and the connection terminal 122 is greater than a height of a 1-2 redistribution via 113-2 that connects the uppermost first redistribution layer 112a and the pattern portion 152.

In an embodiment, the connection terminal 122 and the pattern portion 152 have side surfaces that contact the uppermost first insulating layer 111a, and the second height h2 of the side surface of the pattern portion 152 is greater than the first height h1 of the side surface of the connection terminal 122. For example, the first height h1 is in a range from about 1 μm to about 6 μm, and the second height h2 is in a range from about 5 μm to about 15 μm. However, the first and second heights h1 and h2 are not limited to the above-described numerical ranges.

As described above, according to an embodiment of the present inventive concept, the pattern portion 152 buried in the first insulating layer 111 is formed in a lower portion of the through-via 150 to substantially redistribute a position of the via portion 153, without increasing congestion of the first redistribution layer 112. The pattern portion 152 is buried in the first insulating layer 111 at substantially the same level as the connection terminal 122 of the semiconductor chip 120, but has structural features that differ from the connection terminal 122. This is due to characteristics of processes that form the pattern portion 152, functional characteristics of the pattern portion 152, etc. In addition, since the pattern portion 152 extends in a horizontal direction from a lower portion of the via portion 153 and is not directly connected to the connection terminal 122, a contact point of the first redistribution layer 112 and the through-via 150 can be freely designed, and as a result, congestion of the first redistribution layer 112 is reduced and the design freedom of the first redistribution layer 112 is increased.

Figure 2:
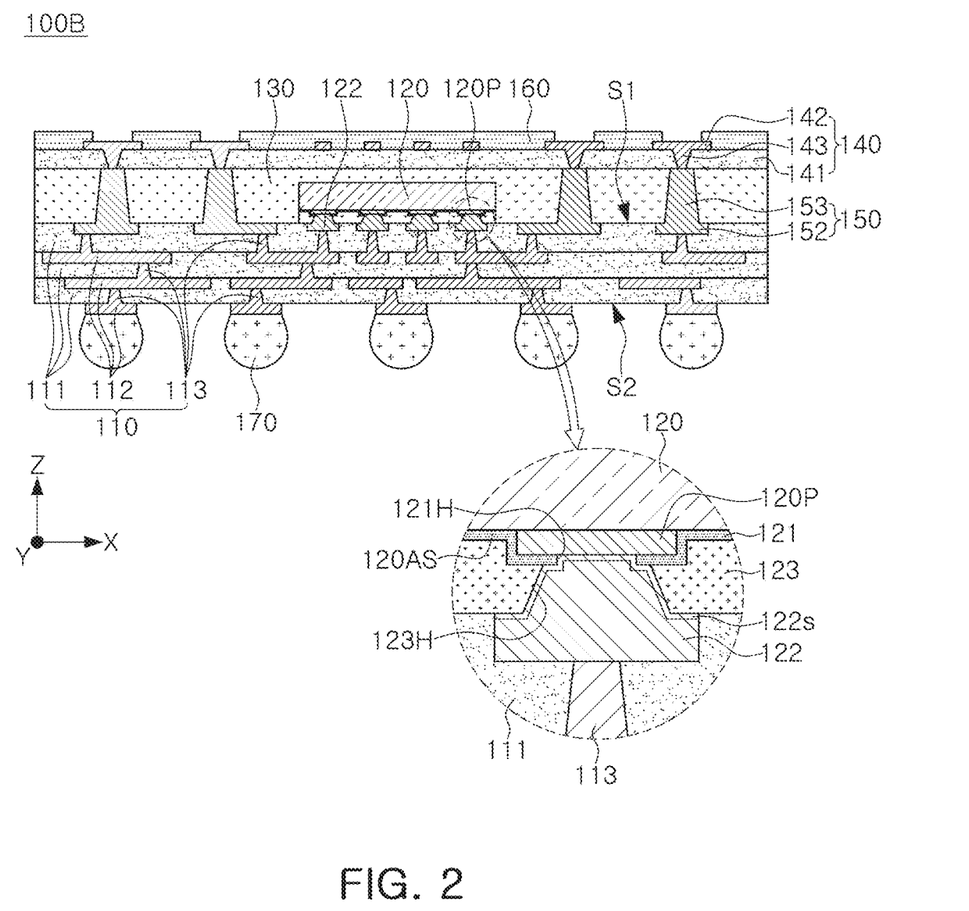
FIG. 2 is a cross-sectional view of a semiconductor package according to an embodiment of the present inventive concept.

FIG. 2 is a cross-sectional view of a semiconductor package 100B according to an embodiment of the present inventive concept.

Referring to FIG. 2, in a semiconductor package 100B according to an embodiment, a semiconductor chip 120 further includes a connection pad 120P disposed on an active surface 120AS, and protective layers 121 and 123 that cover the connection pad 120P. In an embodiment, a connection terminal 122 has a metal post shape that extends through the protective layers 121 and 123 and electrically connects to the connection pad 120P.

The active surface 120AS of the semiconductor chip 120 is one surface of a body on which an integrated circuit is formed. The body includes a semiconductor substrate that includes a semiconductor element such as silicon or germanium, or a compound semiconductor such as silicon carbide (SiC), gallium arsenide (GaAs), indium arsenide (InAs), or indium phosphide (InP), and an integrated circuit (IC) formed on the semiconductor substrate. The connection pad 120P on the active surface 120AS is electrically connected to the integrated circuit. The connection pad 120P includes a conductive material, such as aluminum (Al), but is not limited thereto, and in other embodiments includes other types of conductive materials.

The protective layers 121 and 123 are disposed below the active surface 120AS and cover at least a portion of the connection pad 120P. The protective layers 121 and 123 protect the semiconductor chip 120 that has been processed on a wafer level, and protect the semiconductor chip 120 from mechanical and thermal stress applied in a packaging process. The protective layers 121 and 123 include a heat and chemical resistant insulating material that has excellent mechanical and electrical properties, etc. In an embodiment, the protective layers 121 and 123 are divided into a first protective layer 121 and a second protective layer 123 that include different insulating materials. For example, the first protective layer 121 includes a silicon oxide film or a silicon nitride film, and the second protective layer 123 includes a photosensitive polyimide (PSPI).

The connection terminal 122 is formed by plating a metal in a first through-hole 121H of the first protective layer 121 and a second through-hole 123H of the second protective layer 123. The metal is, for example, at least one of copper (Cu), aluminum (Al), silver (Ag), tin (Sn), gold (Au), nickel (Ni), lead (Pb), or titanium (Ti), or alloys thereof. A seed layer 122s is disposed between the connection terminal 122 and the connection pad 120P, between the first and second protective layers 121 and 123, and between the connection terminal 122 and the second protective layer 123. The seed layer 122s is formed by depositing a metal, such as titanium (Ti) or copper (Cu), etc., on surfaces of the protective layers 121 and 123 and exposed surfaces of connection pad 120P. The connection terminal 122 is located at substantially the same first level as a pattern portion 152 of a through-via 150, and is electrically connected to the pattern portion 152 of the through-via 150 through a first redistribution layer 112 at a second level lower than the first level.

Figure 3:
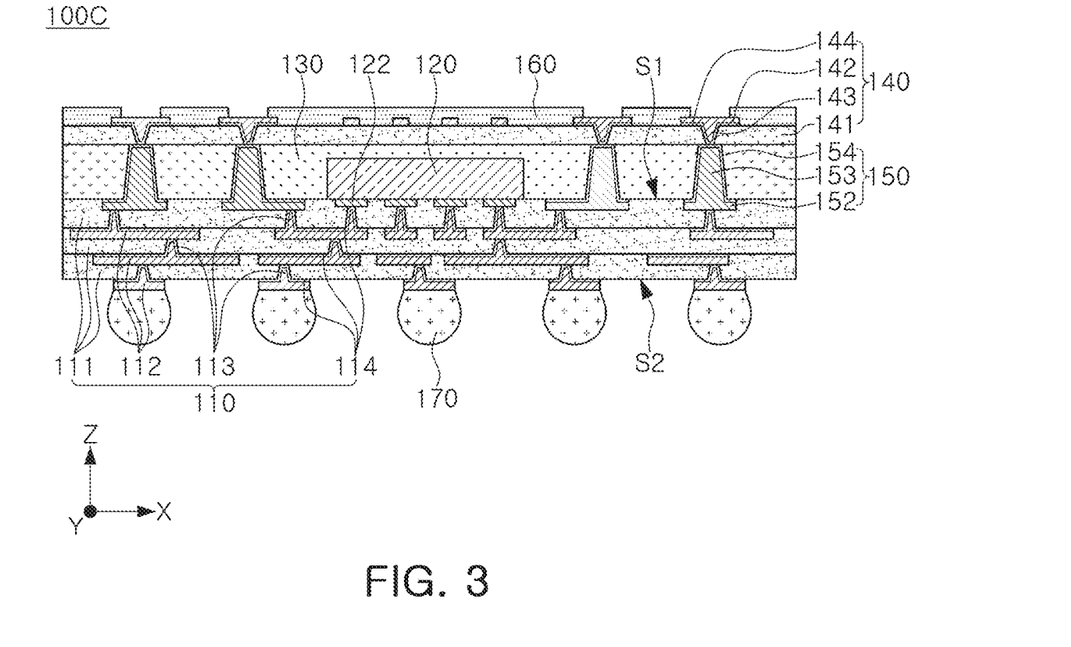
FIG. 3 is a cross-sectional view of a semiconductor package according to an embodiment of the present inventive concept.

FIG. 3 is a cross-sectional view of a semiconductor package 100C according to an embodiment of the present inventive concept.

Referring to FIG. 3, a semiconductor package 100C according to an embodiment has the same or similar characteristics as those described with reference to FIGS. 1A and 1B, except that a first redistribution structure 110, a second redistribution structure 140, and a through-via 150 further include seed layers 114, 144, and 154, respectively.

The first and second redistribution structures 110 and 140 further include first and second seed layers 114 and 144, respectively. The first seed layer 114 is disposed between a first insulating layer 111 and a first redistribution layer 112, and between the first insulating layer 111 and a first redistribution via 113, and is distinguishable by a boundary between the first seed layer 114 and the first redistribution layer 112, and a boundary between the first seed layer 114 and the first redistribution via 113. The second seed layer 144 is disposed between a second insulating layer 141 and a second redistribution layer 142, and between the second insulating layer 141 and a second redistribution via 143, and is distinguishable by a boundary between the second seed layer 144 and the second redistribution layer 142, and a boundary between the second seed layer 144 and the second redistribution via 143. The first and second seed layers 114 and 144 are formed by a deposition process, such as a sputtering process, and include, for example, a metal such as titanium (Ti) or copper (Cu), etc.

The through-via 150 further includes a third seed layer 154 disposed along an upper surface of a pattern portion 152, and a side surface and an upper surface of a via portion 153. The third seed layer 154 is formed by an electroless plating process, and includes substantially the same metal as the pattern portion 152 and the via portion 153, such as copper (Cu) or an alloy thereof. In an embodiment, a boundary between the pattern portion 152 and the via portion 153 is not clearly defined in the third seed layer 154. Unlike the first and second seed layers 114 and 144, since the third seed layer 154 does not have a clear boundary, a height h2 of the pattern portion 152 described with reference to FIGS. 1A and 1B is a height that includes the third seed layer 154.

Figure 4:
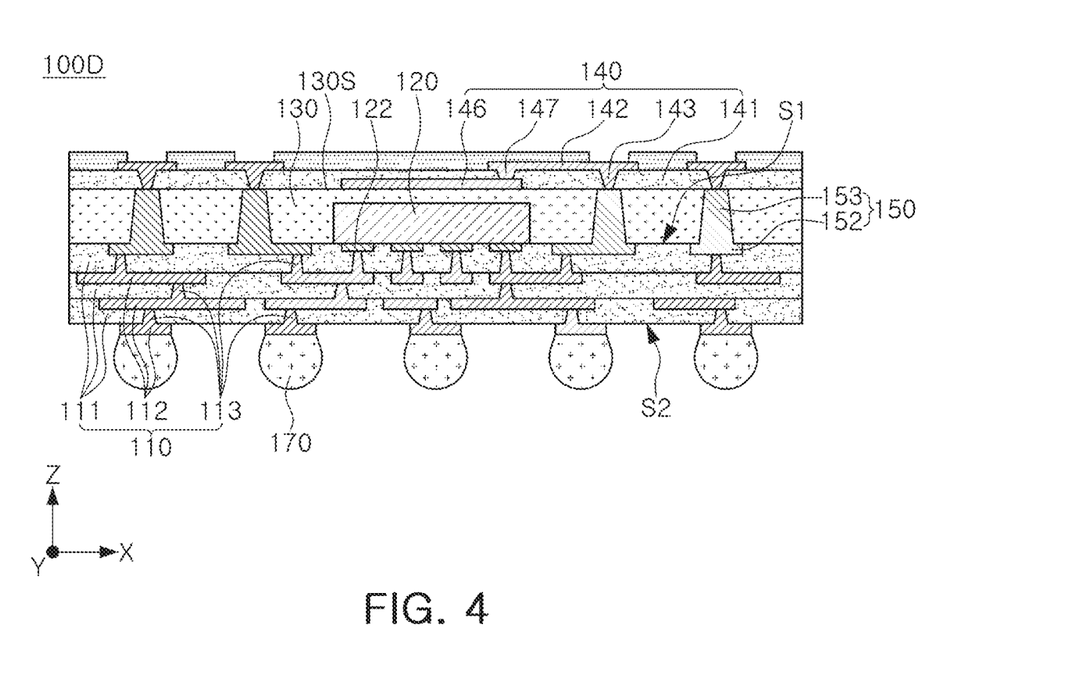
FIG. 4 is a cross-sectional view of a semiconductor package according to an embodiment of the present inventive concept.

FIG. 4 is a cross-sectional view of a semiconductor package 100D according to an embodiment of the present inventive concept.

Referring to FIG. 4, in a semiconductor package 100D according to an embodiment, a second redistribution structure 140 further includes a wiring layer 146 disposed directly on an upper surface 130S of an encapsulant 130 and covered by a second insulating layer 141, and a wiring via 147 that penetrates through a portion of the second insulating layer 141 that covers the wiring layer 146 and electrically connects the wiring layer 146 and a second redistribution layer 142.

The wiring layer 146 is located at a level between a lower surface of the second redistribution layer 142 and an upper surface of the through-via 150. The wiring layer 146 is electrically connected to a through-via 150 by a path that passes through the second redistribution layer 142. In an embodiment, the wiring layer 146 is electrically connected to the through-via 150 via the wiring via 147, the second redistribution layer 142, and a second redistribution via 143.

To implement a package-on-package (POP) structure in which a high-performance semiconductor chip is buried, a fine-pitch backside redistribution layer needs to be formed on an upper surface of a lower semiconductor package. When fine-pitch backside redistribution layers are concentrated at one level, such as a level on which the second redistribution layer 142 is disposed, signal and power characteristics can deteriorate. Since the semiconductor package 100D according to an embodiment includes the wiring layer 146 and the second redistribution layer 142 as a backside redistribution layer disposed at different levels on an upper surface thereof, excellent signal and power characteristics can be secured by a proper arrangement of a signal pattern and a ground pattern. In addition, since the wiring layer 146 is connected to the through-via 150 via the second redistribution layer 142, a via process is omitted at a level between the wiring layer 146 and the upper surface of the through-via 150, which, as a result, reduces an overall thickness of the semiconductor package 100D.

Figure 7A:
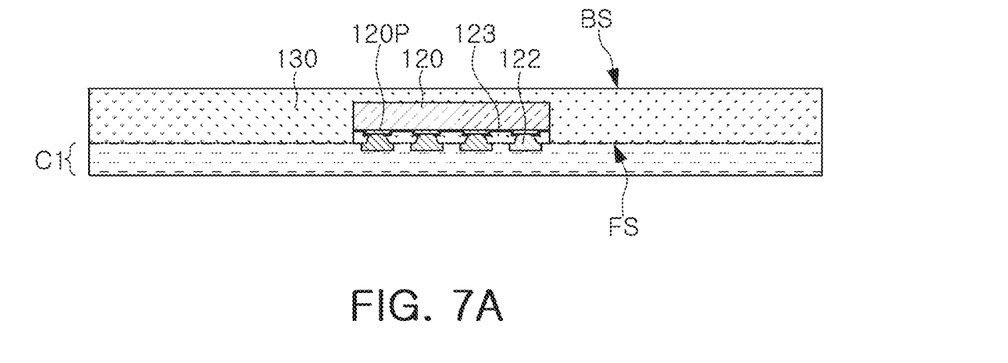
FIGS. 7A to 7I are cross-sectional views that sequentially illustrate steps of a method of manufacturing a semiconductor package illustrated in FIG. 6.
Figure 7B:
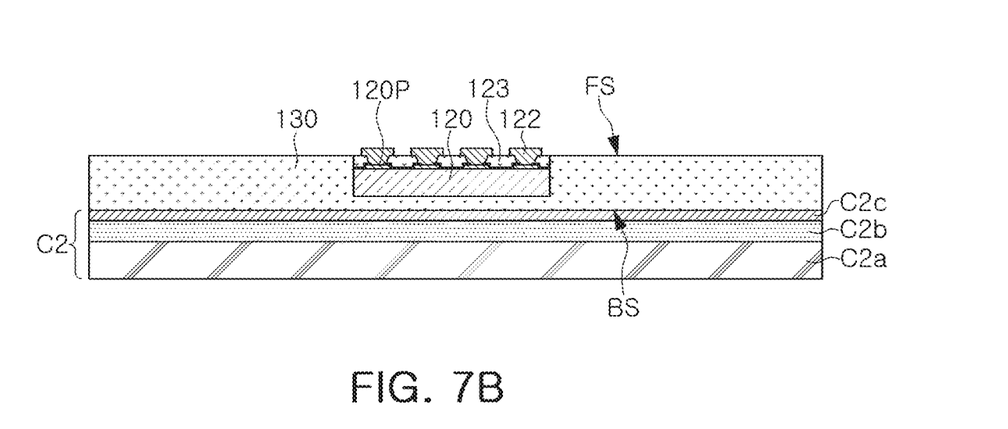
Figure 7C:
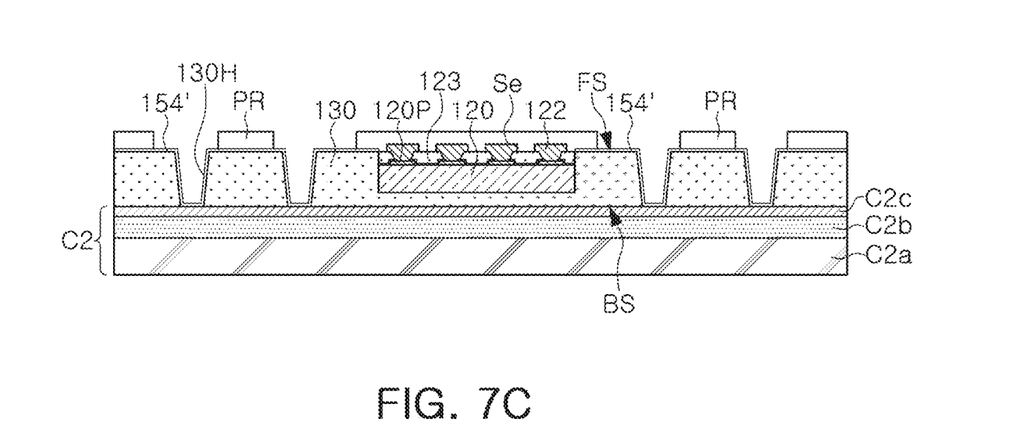
Figure 7D:
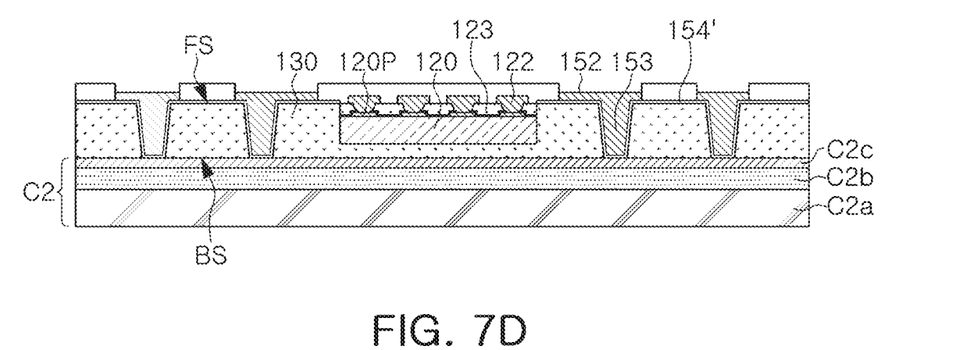
Figure 7E:
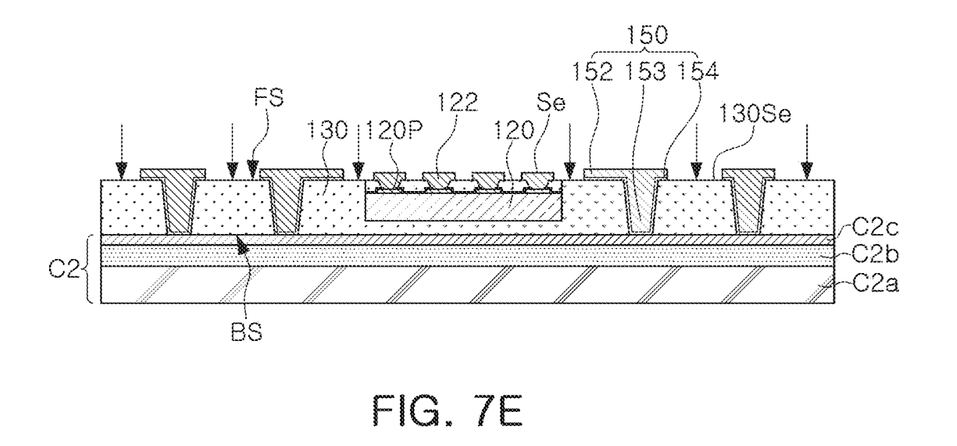
Figure 7F:
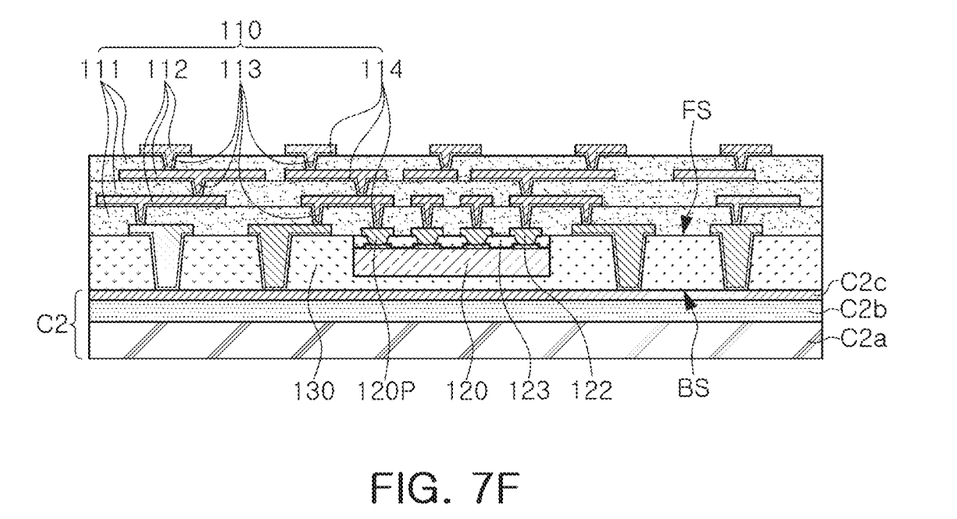
Figure 7G:
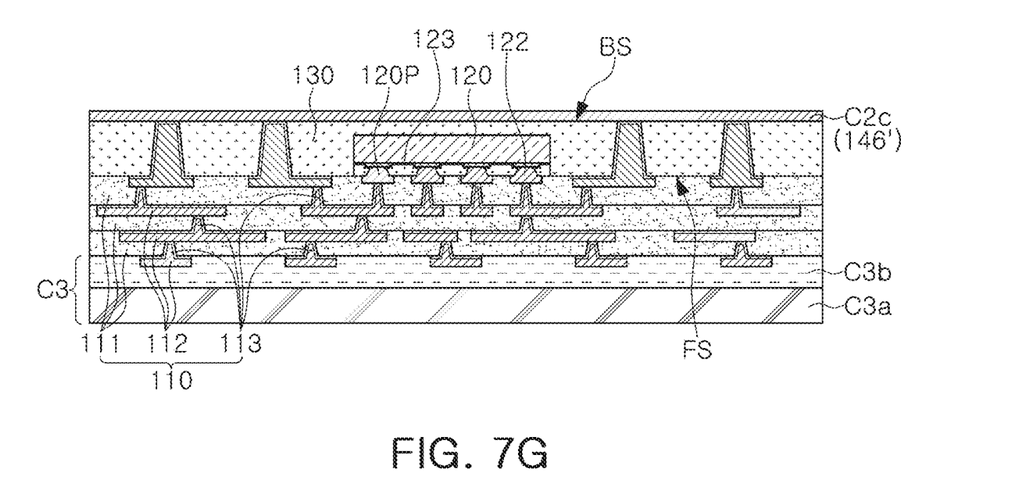
Figure 7H:
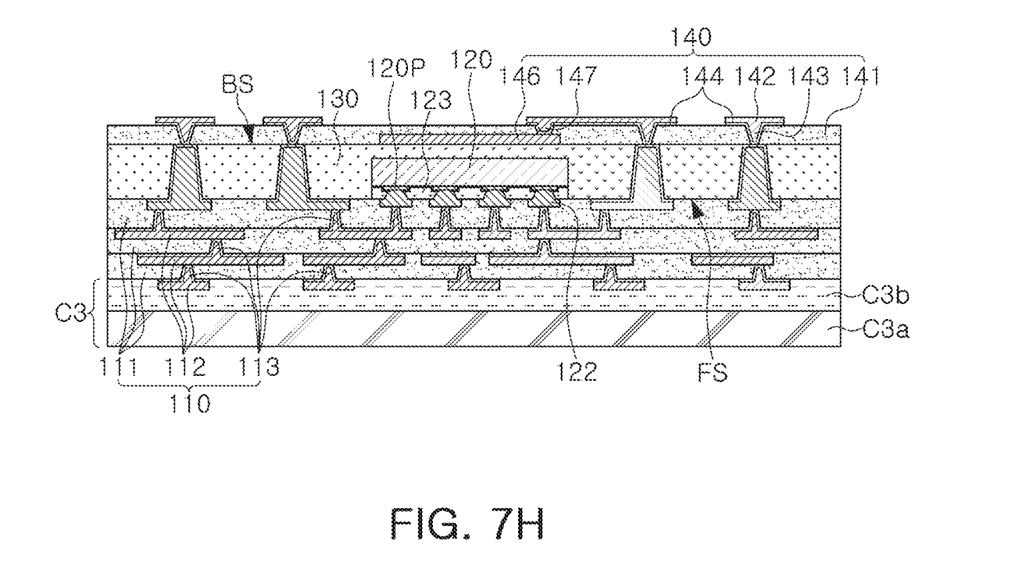

In addition, in some embodiments, since the wiring layer 146 is formed by etching a metal plate that remains on the upper surface 130S of the encapsulant 130 during a process of manufacturing the semiconductor package 100D, a separate seed layer is not needed, as shown in FIGS. 7G and 7H. For example, the wiring layer 146 may have a single-layer structure in which a seed layer is not distinguishable, or may have a multi-layer structure as shown in FIG. 3 in which a seed layer is disposed below the second redistribution layer 142.

Figure 5:
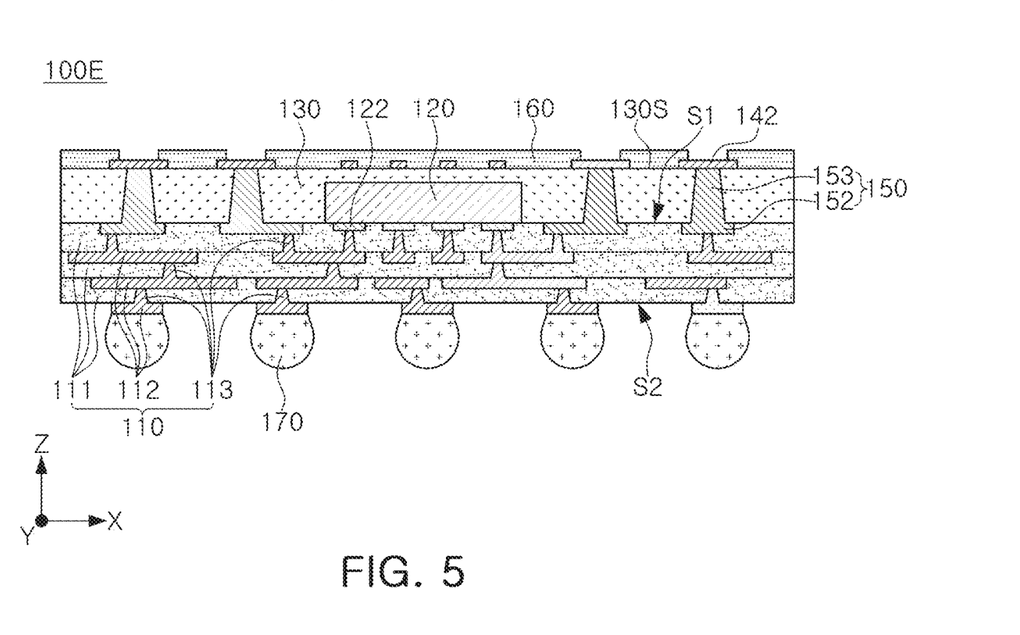
FIG. 5 is a cross-sectional view of a semiconductor package according to an embodiment of the present inventive concept.

FIG. 5 is a cross-sectional view of a semiconductor package 100E according to an embodiment of the present inventive concept.

Referring to FIG. 5, a semiconductor package 100E according to an embodiment has the same or similar characteristics as those described with reference to FIGS. 1A and 1B, except that a second redistribution layer 142 is formed in close contact with an upper surface 130S of an encapsulant 130. In this embodiment, a second insulating layer 141 and a second redistribution via 143, illustrated in FIG. 1A, are omitted. According to an embodiment of FIG. 1A, etc., a second redistribution layer 142 that has a fine pitch is formed using a second insulating layer 141 formed on an upper surface 130S of an encapsulant 130. In a present embodiment, since the second redistribution layer 142 is directly formed on the upper surface 130S of the encapsulant 130, a via process that connects the second redistribution layer 142 and a through-via 150 is omitted. As a result, an overall thickness of the semiconductor package 100E is reduced.

Figure 6:
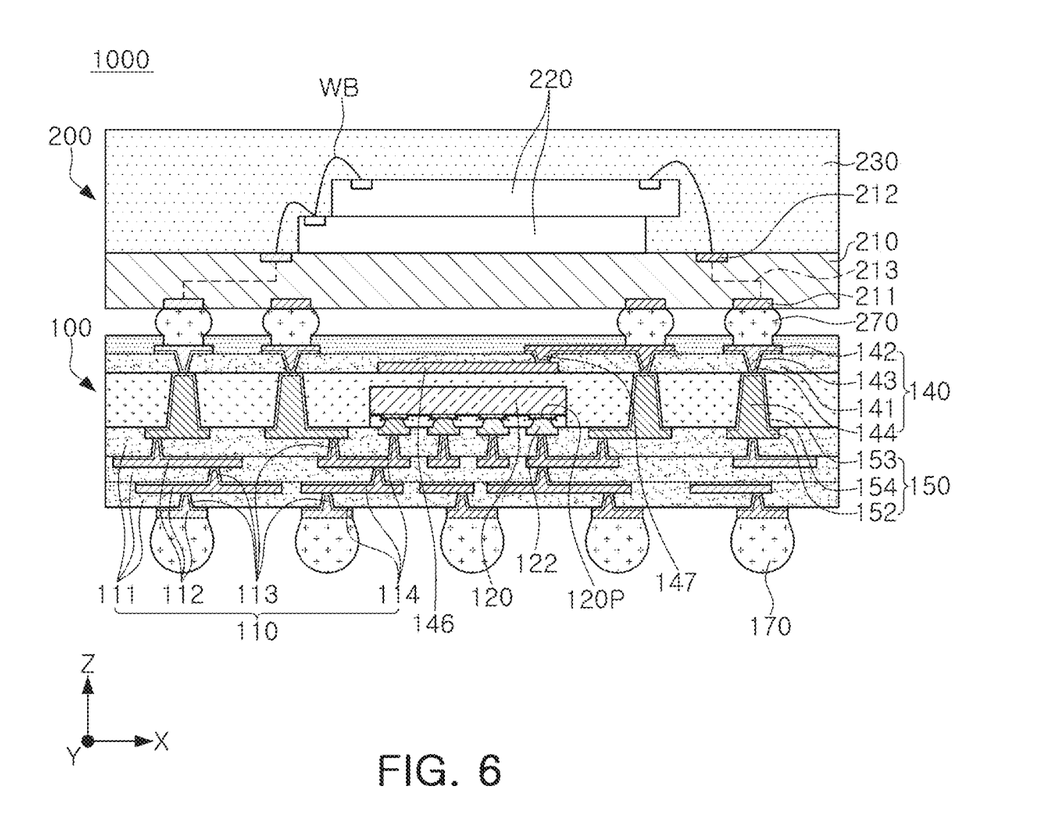
FIG. 6 is a cross-sectional view of a semiconductor package according to an embodiment of the present inventive concept.

FIG. 6 is a cross-sectional view of a semiconductor package 1000 according to an embodiment of the present inventive concept.

Referring to FIG. 6, a semiconductor package 1000 according to an embodiment includes a first package 100 and a second package 200. The first package 100 has the same or similar characteristics as the semiconductor packages 100A, 100B, 100C, 100D, and 100E described with reference to FIGS. 1A to 5. The first package 100 illustrated in FIG. 6 includes features of embodiments of FIGS. 2 to 4.

The second package 200 includes a redistribution substrate 210, a second semiconductor chip 220, and a second encapsulant 230. The second redistribution substrate 210 includes pads 211 and 212 on a lower surface and an upper surface of the redistribution substrate 210, respectively, that are externally electrically connected. In addition, the second redistribution substrate 210 includes a redistribution circuit 213 connected to the pads 211 and 212 therein.

The second semiconductor chip 220 is mounted on the second redistribution substrate 210 by wire bonding or flip-chip bonding. For example, a plurality of second semiconductor chips 220 are vertically stacked on the redistribution substrate 210, and are electrically connected to an upper pad 212 of the redistribution substrate 210 by a bonding wire WB. In an embodiment, the second semiconductor chip 220 is a memory chip, and a first semiconductor chip 120 is an AP chip.

The second encapsulant 230 includes the same or a similar material to an encapsulant 130 of the first package 100. The second package 200 is physically and electrically connected to the first package 100 by a metal bump 270. The metal bump 270 is electrically connected to the redistribution circuit 213 inside the redistribution substrate 210 through a lower pad 211 on the lower surface of the redistribution substrate 210. The metal bump 270 is formed of a low-melting-point metal, such as tin (Sn) or an alloy thereof.

According to a present inventive concept, a pattern portion 152 is introduced below a through-via 150 that provides a vertical connection path in the first package 100 that substantially redistributes a position of the through-via 150, or via portion 153, without increasing congestion of a first redistribution layer 112. The pattern portion 152 is buried in a first insulating layer 111 at substantially the same level as a connection terminal 122 of the semiconductor chip 120, is not directly connected to the connection terminal 122, but is connected to the connection terminal 122 through the first redistribution layer 112 disposed below the first insulating layer 111. Therefore, the pattern portion 152 freely designs a contact point between the first redistribution layer 112 and the through-via 150 or the via portion 153, which reduces congestion of the first redistribution layer 112 and increases design freedom of the first redistribution layer 112.

FIGS. 7A to 7I are cross-sectional views that sequentially illustrate steps of a method of manufacturing the first package 100 illustrated in FIG. 6.

Referring to FIG. 7A, in an embodiment, first, an encapsulant 130 that seals a semiconductor chip 120 is formed on a first carrier C1. The first carrier C1 is an adhesive carrier, such as a tape. The semiconductor chip 120 includes a connection terminal 122 that is buried in the first carrier C1. The semiconductor chip 120 includes a connection pad 120P and a protective layer 123 that covers the connection pad 120P. The encapsulant 130 is formed by, for example, coating and curing an insulating material such as ABF or EMC, etc., on the first carrier C1. An upper surface of the encapsulant 130 is planarized by, for example, a chemical mechanical polishing (CMP) process. For convenience of description, a surface of the encapsulant 130 that faces the carrier C1 is referred to as a front side FS, and a surface opposite thereto is referred to as a back side BS. The semiconductor chip 120 is embedded in the front side FS of the encapsulant 130. The first carrier C1 is removed from the encapsulant 130, exposing the front side FS of the encapsulant 130 and the connection terminal 122.

Referring to FIG. 7B, in an embodiment, the encapsulant 130 and the semiconductor chip 120 are disposed on a second carrier C2 to face the front side FS in an upward direction. That is, the second carrier C2 is attached to the back side BS of the encapsulant 130. Therefore, the semiconductor chip 120 has a face-up shape in which the connection terminal 122 faces an upward direction, i.e., a direction away from front side FS of the encapsulant 130. The second carrier C2 includes a base layer C2a, an intermediate layer C2b disposed on the base layer C2a, and a metal layer C2c disposed on the intermediate layer C2b. The metal layer C2c is in contact with the back side BS of the encapsulant 130. The base layer C2a, the intermediate layer C2b, and the metal layer C2c include different materials. For example, the base layer C2a is a copper clad laminate (CCL), the intermediate layer C2b is a polymer layer that includes an insulating material such as ABF, etc., and the metal layer C2c is a copper (Cu) plate disposed on the intermediate layer C2b. After a process of manufacturing a package is completed, the metal layer C2c may remain on the back side BS to form a backside redistribution layer 146 shown in FIG. 6.

Referring to FIG. 7C, in an embodiment, a through-hole 130H is formed that penetrates through the encapsulant 130, and a seed layer 154' is formed along an inner wall of the through-hole 130H and the front side FS of the encapsulant 130. The through-hole 130H is completely penetrates through the encapsulant 130 from the front side FS to the back side BS. The through-hole 130H is formed using, for example, a laser drill. In an embodiment, the through-hole 130H has a tapered side surface whose width thereof becomes narrower as it approaches the back side BS. The seed layer 154' is formed on a portion of the front side FS of the encapsulant 130, the inner wall of the through-hole 130H, and a portion of an upper surface of the metal layer C2c exposed through the through-hole 130H but not on a surface Se of the semiconductor chip 120. The surface Se of the semiconductor chip 120 is covered by the protective layer 123 and a portion of the metal layer C2c, such as a titanium layer, that covers a surface of the connection terminal 122. Since the metal layer C2c is very thin, e.g., about 0.1 μm, a level of the surface Se of the semiconductor chip 120 illustrated in the drawings is not substantially affected. The seed layer 154' includes, for example, copper (Cu), and is formed using an electroless plating process. Next, an exposure and development process is performed to form a patterned photoresist PR on the seed layer 154'.

Referring to FIG. 7D, in an embodiment, a via portion 153 is formed that fills the through-hole 130H and a pattern portion 152 is formed on the front side FS using the seed layer 154' exposed from the patterned photoresist PR. The via portion 153 and the pattern portion 152 are formed by, for example, performing an electroplating process. The via portion 153 and the pattern portion 152 include, for example, a metal such as copper (Cu) or an alloy thereof. In an embodiment, the seed layer 154', the via portion 153, and the pattern portion 152 include the same metal, such as copper (Cu), and a boundary between the seed layer 154', the via portion 153, and the pattern portion 152 is not clearly distinguishable. In an embodiment of the present inventive concept, the pattern portion 152 is introduced to substantially redistribute a position of the via portion 153 without increasing congestion of the first redistribution layer 112.

Referring to FIG. 7E, in an embodiment, the photoresist PR shown in FIG. 7D is removed, and a portion of the seed layer 154 shown in FIG. 7D and exposed through the pattern portion 152 is removed to form a through-via 150. The through-via 150 has an integrated structure in which a boundary of the via portion 153 and the pattern portion 152 is not distinguishable. That is, the via portion 153 and the pattern portion 152 are integrally formed. In an embodiment, in the through-via 150, a boundary between a patterned seed layer 154, the via portion 153, and the pattern portion 152 is not clearly distinguishable. That is, the patterned seed layer 154, the via portion 153, and the pattern portion 152 are integrally formed. The seed layer 154 is patterned by an etching process, and a surface 130Se of the encapsulant 130 is exposed where the seed layer 154 is removed. In addition, a metal film, such as a titanium film, on the surface Se of the semiconductor chip 120 and described with reference to FIG. 7C is removed by the etching process of the seed layer 154. For example, since the seed layer 154 and the metal layer include different metals, the seed layer 154 and the metal layer are removed by a wet etching process that uses a different etchant.

Referring to FIG. 7F, in an embodiment, a first redistribution structure 110 is formed on the front side FS of the encapsulant 130. The first redistribution structure 110 includes at least one first insulating layer 111 disposed on the front side FS, at least one first redistribution layer 112 respectively disposed on the at least one first insulating layer 111, and a first redistribution via 113 that respectively penetrates through the at least one first insulating layer 111 and connects the at least one first redistribution layer 112 to the pattern portion 152 and the connection terminal 122. The first insulating layer 111 is formed by coating and curing a photosensitive resin, such as a PID, on the front side FS of the encapsulant 130. Next, an exposure process and a development process that uses a photomask are performed to form via holes that penetrate through the first insulating layer 111. Next, a seed layer 114, the first redistribution via 113, and the first redistribution layer 112 are formed using a deposition process, an electroless plating process, and an electrolytic plating process. The seed layer 114 is formed by, for example, a sputtering process, and includes, for example, a metal such as titanium (Ti) or copper (Cu), etc. The first redistribution via 113 and the first redistribution layer 112 are formed by, for example, an electroplating process, and include a metal such as copper (Cu), etc. By repeating the above-described process, a plurality of first insulating layers 111, a plurality of first redistribution vias 113, and a plurality of first redistribution layers 112 are formed.

In the drawing, a lowermost first insulating layer 111 is formed that covers the connection terminal 122 and the pattern portion 152, and the connection terminal 122 and the pattern portion 152 are electrically connected to each other by a lowermost first redistribution layer 112 that is disposed on the lowermost first insulating layer 111. Therefore, according to a process of manufacturing a semiconductor package according to an embodiment, a contact point of the first redistribution layer 112 and the through-via 150 or the via portion 153 is freely designed, which provides a semiconductor package that has a high degree of design freedom of the first redistribution layer 112.

Referring to FIG. 7G, in an embodiment, after inverting the semiconductor package and attaching a third carrier C3 onto the first redistribution structure 110, the second carrier C2 shown in FIG. 7F, except the metal layer C2c, is removed. The metal layer C2c is patterned in a subsequent process while being attached to the back side BS of the encapsulant 130. Before being patterned, the metal layer C2c is used as a base material 146' of the wiring layer 146 shown in FIG. 7H. The third carrier C3 includes a base layer C3a and an intermediate layer C3b, similar to the second carrier C2 described with reference to FIG. 7B. For example, the base layer C3a is a copper clad laminate CCL, and the intermediate layer C3b is a polymer layer that includes an insulating material such as ABF, etc.

Referring to FIG. 7H, in an embodiment, a second redistribution structure 140 is formed on the back side BS of the encapsulant 130. The second redistribution structure 140 includes a second insulating layer 141, a second redistribution layer 142, a second redistribution via 143, a seed layer, a wiring layer 146, and a wiring via 147. The second insulating layer 141 is formed by coating and curing a photosensitive resin, such as PID, on the back side BS of the encapsulant 130. Next, an exposure process and a development process is performed that uses a photomask to form via holes that penetrate through the second insulating layer 141. Next, the seed layer 144, the second redistribution via 143, and the second redistribution layer 142 are formed using a deposition process, an electroless plating process, and an electroplating process. The seed layer 144 is formed by, for example, a sputtering process, and includes, for example, a metal such as titanium (Ti) or copper (Cu), etc. The second redistribution via 143 and the second redistribution layer 142 are formed by, for example, an electroplating process, and include a metal such as copper (Cu), etc.

The wiring layer 146 is formed by etching a base material 146 shown in FIG. 7G that is attached on the back side BS of the encapsulant 130. Unlike the second redistribution layer 142, the wiring layer 146 does not use a plating process, and thus has a single-layer structure without a seed layer. The wiring layer 146 is electrically connected to the second redistribution layer 142 through the wiring via 147. The wiring via 147 is formed during formation of the seed layer 144 and the second redistribution via 143. Since the wiring layer 146 is connected to the through-via 150 through the second redistribution layer 142, a signal pattern and a ground pattern can be disposed on the wiring layer 146 and the second redistribution layer 142 to secure excellent signal and power characteristics. In addition, since a via process is omitted at a level between the wiring layer 146 and an upper surface of the through-via 150, an overall thickness of the semiconductor package is reduced.

Figure 7I:
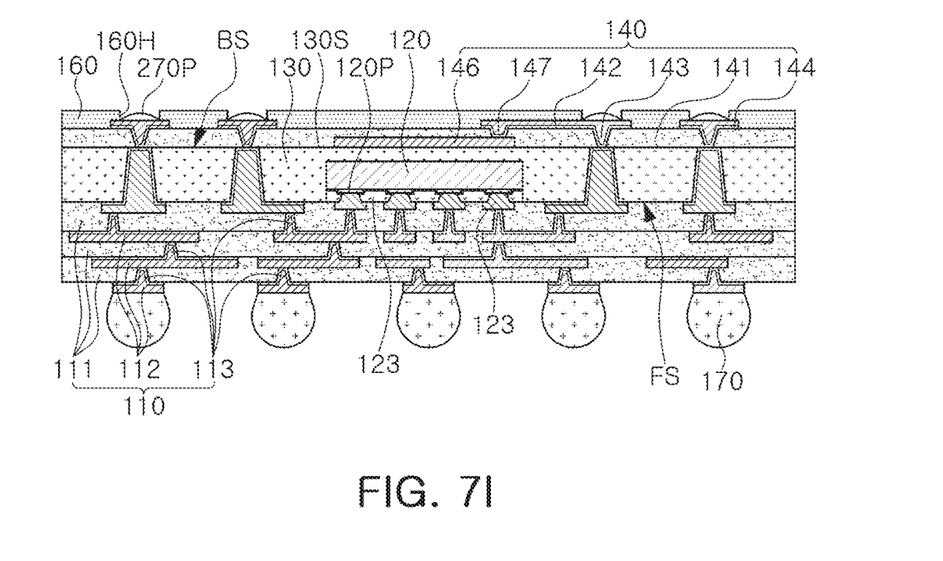

Referring to FIG. 7I, in an embodiment, a cover layer 160 is formed on the second redistribution structure 140. The cover layer 160 has an opening 160H that exposes a portion of the second redistribution layer 142, and a bump pad 270P is formed on the second redistribution layer 142 exposed through the cover layer 160. The cover layer 160 is formed by coating and curing an insulating material, such as ABF. The bump pad 270P is formed by applying a solder paste in the opening 160H. Thereafter, the third carrier C3 shown in FIG. 7H is removed from the first redistribution structure 110, and a connection bump 170 is formed below the first redistribution structure 110. The connection bump 170 is formed by attaching a solder ball on a lowermost first redistribution layer 112. In some embodiments, similar to the cover layer 160 formed on the second redistribution structure 140, a cover layer that covers at least a portion of the lowermost first redistribution layer 112 is formed.

According to embodiments of the present inventive concept, a semiconductor package that has a high degree of freedom in designing a redistribution layer is provided by introducing a pattern portion below a through-via.

While embodiments have been illustrated and described above, it will be apparent to those skilled in the art that modifications and variations could be made without departing from the scope of embodiments of the present inventive concept as defined by the appended claims.

What is claimed is:

1. A method of manufacturing semiconductor package, comprising:

forming an encapsulant structure that includes a semiconductor chip that includes a connection terminal and an encapsulant that seals the semiconductor chip, wherein the encapsulant structure includes a front side from which the connection terminal protrudes and a back side opposite to the front side;

forming a through-hole that penetrates through the encapsulant from the front side to the back side;

forming a seed layer that extends along an inner wall of the through-hole and the front side of the encapsulant structure;

forming a through via that includes a via portion in the through-hole and a pattern portion that protrudes on the front side of the encapsulant structure;

removing a portion of the seed layer exposed by the pattern portion of the through via;

forming a front redistribution structure from the front side of the encapsulant structure, wherein the front redistribution structure includes a front insulating layer that covers the connection terminal and the pattern portion, front redistribution layers on the front insulating layer, and frontside vias that penetrate through the front insulating layer and electrically connect the front redistribution layers to the connection terminal and the pattern portion of the through via; and forming a back redistribution structure on the back side of the encapsulant structure, wherein the back redistribution structure includes a back insulating layer, back redistribution layers on the back insulating layer, and backside vias that penetrate through the back insulating layer and electrically connect the back redistribution layers to the via portion of the through via, wherein a lower surface of the connection terminal is located at a first level, and a lower surface of the pattern portion is located at a second level lower than the first level.

2. The method of manufacturing semiconductor package according to claim 1, wherein the via portion has a tapered shape toward the back side of the encapsulant structure.

3. The method of manufacturing semiconductor package according to claim 1, wherein the frontside vias are in contact with the lower surface of the connection terminal, and the lower surface of the pattern portion of the through via.

4. The method of manufacturing semiconductor package according to claim 1, wherein the frontside vias comprise
 a first frontside via that electrically connects the front redistribution layers to the connection terminal, and
 a second frontside via that electrically connects the front redistribution layers to the pattern portion of the through via, wherein
 a height of the first frontside via is greater than a height of the second frontside via.

5. The method of manufacturing semiconductor package according to claim 1, wherein the backside vias comprise a first backside via in contact with an upper surface of the via portion of the through via.

6. The method of manufacturing semiconductor package according to claim 5, wherein the upper surface of the via portion is coplanar with the back side of the encapsulant structure.

7. The method of manufacturing semiconductor package according to claim 1, further comprising, before forming the back redistribution structure,
 patterning a metal layer attached to the back side of the encapsulant structure,
 wherein the patterned metal layer is covered by the back insulating layer.

8. The method of manufacturing semiconductor package according to claim 7, wherein the backside vias comprise
 a first backside via in contact with an upper surface of the via portion of the through via, and
 a second backside via in contact with an upper surface of the patterned metal layer.

9. The method of manufacturing semiconductor package according to claim 8, wherein a height of the first backside via is greater than a height of the second backside via.

10. The method of manufacturing semiconductor package according to claim 1,
 wherein the connection terminal includes a first side surface,
 wherein the pattern portion includes a second side surface that faces the first side surface of the connection terminal in a first direction, and
 wherein the front insulating layer fills between the first side surface and the second side surface in the first direction.

11. The method of manufacturing semiconductor package according to claim 1, wherein the through via has an integrated structure in which a boundary between the pattern portion and the via portion is not distinguishable.

12. The method of manufacturing semiconductor package according to claim 1, wherein at least a portion of an upper surface of the pattern portion is in contact with the encapsulant.

13. He method of manufacturing semiconductor package according to claim 12, wherein the seed layer is disposed between the upper surface of the pattern portion and the encapsulant.

14. A method of manufacturing semiconductor package, comprising:
 forming an encapsulant structure that has a front surface from which a connection terminal protrudes and a back surface opposite to the front surface, wherein the encapsulant structure includes a semiconductor chip that has a front side on which the connection terminal is disposed, and an encapsulant that covers a back side of the semiconductor chip and a lateral side of the semiconductor chip, wherein the front side of the semiconductor chip provides the front surface of the encapsulant structure;
 forming a through-hole that penetrates through the encapsulant from the front surface to the back surface, wherein the through-hole has a tapered shape toward the back surface of the encapsulant structure;
 forming a through via that includes a via portion in the through-hole and a pattern portion disposed on the front surface of the encapsulant structure, wherein the pattern portion extends along the front surface to overlap the connection terminal in a lateral direction parallel to the front surface, and is electrically insulated from the semiconductor chip and the connection terminal;
 forming a front redistribution structure on the front surface of the encapsulant structure, wherein the forming of the front redistribution structure comprises, forming front redistribution layers, and frontside vias that electrically connect the pattern portion of the through via to the semiconductor chip and the connection terminal; and
 forming a back redistribution structure on the back surface of the encapsulant structure, wherein the back redistribution structure includes back redistribution layers, and backside vias electrically that connect the back redistribution layers to the via portion of the through via.

15. The method of manufacturing semiconductor package according to claim 14, wherein the frontside vias comprise
 a first frontside via connected to the connection terminal, and
 a second frontside via connected to the pattern portion of the through via, wherein
 a height of the first frontside via is greater than a height of the second frontside via.

16. A method of manufacturing semiconductor package, comprising:
 forming an encapsulant structure that has a front surface from which a connection terminal protrudes and a back surface opposite to the front surface, wherein the encapsulant structure includes a semiconductor chip that has a front side on which the connection terminal is disposed, and an encapsulant that covers a back side of the semiconductor chip and a lateral side of the semiconductor chip, wherein the front side of the semiconductor chip provides the front surface of the encapsulant structure;
 forming a through-hole that penetrates through the encapsulant from the front surface to the back surface;
 forming a through via that includes a via portion in the through-hole and a pattern portion disposed on the front surface of the encapsulant structure, wherein the pattern portion extends along the front surface to overlap the connection terminal in a lateral direction parallel to the front surface, and is electrically insulated from the semiconductor chip and the connection terminal;

forming a front redistribution structure on the front surface of the encapsulant structure, wherein the forming of the front redistribution structure comprises forming front redistribution layers, and frontside vias that electrically connect pattern portion of the through via to the semiconductor chip and the connection terminal;

forming a metal layer on the back surface of the encapsulant structure; and forming a back redistribution structure on the back surface of the encapsulant structure, wherein the back redistribution structure includes back redistribution layers, and backside vias that electrically connect the back redistribution layers to the via portion of the through via and the metal layer.

17. The method of manufacturing semiconductor package according to claim 16, wherein the backside vias comprise a first backside via connected to the via portion of the through via, and a second backside via connected to the metal layer.

18. The method of manufacturing semiconductor package according to claim 17, wherein a height of the first backside via is greater than a height of the second backside via.

19. The method of manufacturing semiconductor package according to claim 16, wherein a height from the front surface of the encapsulant structure to a lower surface of the connection terminal is lower than a height from the front surface of the encapsulant structure to a lower surface of the pattern portion of the through via.

* * * * *